United States Patent
Chen et al.

(10) Patent No.: US 11,222,710 B1
(45) Date of Patent: Jan. 11, 2022

(54) MEMORY DICE ARRANGEMENT BASED ON SIGNAL DISTRIBUTION

(71) Applicant: Micron Technology, Inc., Boise, ID (US)

(72) Inventors: Mikai Chen, Sunnyvale, CA (US); Zhenming Zhou, San Jose, CA (US); Zhenlei Shen, Milpitas, CA (US); Murong Lang, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/988,897

(22) Filed: Aug. 10, 2020

(51) Int. Cl.
| | |
|---|---|
| *G11C 29/44* | (2006.01) |
| *G11C 29/02* | (2006.01) |
| *G11C 29/12* | (2006.01) |
| *G11C 5/06* | (2006.01) |
| *G11C 5/02* | (2006.01) |

(52) U.S. Cl.
CPC ........... *G11C 29/44* (2013.01); *G11C 29/025* (2013.01); *G11C 29/12005* (2013.01); *G11C 5/025* (2013.01); *G11C 5/06* (2013.01)

(58) Field of Classification Search
CPC . G11C 29/44; G11C 29/025; G11C 29/12005; G11C 5/025; G11C 5/06
USPC .................................. 365/185.09, 51, 63
See application file for complete search history.

(56) References Cited

U.S. PATENT DOCUMENTS

| | | | | |
|---|---|---|---|---|
| 7,102,905 | B2 * | 9/2006 | Funaba | H01L 25/0657 365/51 |
| 7,440,289 | B2 * | 10/2008 | Sugano | G11C 5/00 361/760 |
| 7,493,534 | B2 * | 2/2009 | Pomaranski | G11C 29/56 365/201 |
| 8,510,629 | B2 * | 8/2013 | Tsukada | G06F 11/1044 714/763 |
| 9,489,146 | B2 * | 11/2016 | Erez | G06F 1/206 |
| 9,601,163 | B2 * | 3/2017 | Song | H01L 25/0657 |
| 10,115,437 | B1 * | 10/2018 | Yuan | G11C 29/12 |
| 10,249,598 | B2 | 4/2019 | Meyer | |
| 10,445,269 | B2 | 10/2019 | Best | |
| 10,564,861 | B2 * | 2/2020 | Linnen | G06F 3/0616 |
| 10,691,634 | B2 | 6/2020 | Saito | |
| 10,891,063 | B2 * | 1/2021 | Christensen | G06F 3/0604 |
| 2015/0155876 | A1 | 6/2015 | Jayasena et al. | |

* cited by examiner

*Primary Examiner* — Son L Mai
(74) *Attorney, Agent, or Firm* — Brooks, Cameron & Huebsch, PLLC

(57) ABSTRACT

A method includes determining, for a plurality of memory dice, a signal reliability characteristic and ranking the plurality of memory dice based, at least in part, on the determined reliability characteristics. The method can further include arranging the plurality of memory dice to form a memory device based, at least in part, on the ranking.

19 Claims, 6 Drawing Sheets

US 11,222,710 B1

MEMORY DICE ARRANGEMENT BASED ON SIGNAL DISTRIBUTION

TECHNICAL FIELD

Embodiments of the disclosure relate generally to memory sub-systems, and more specifically, relate to memory dice arrangement based on signal distribution.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
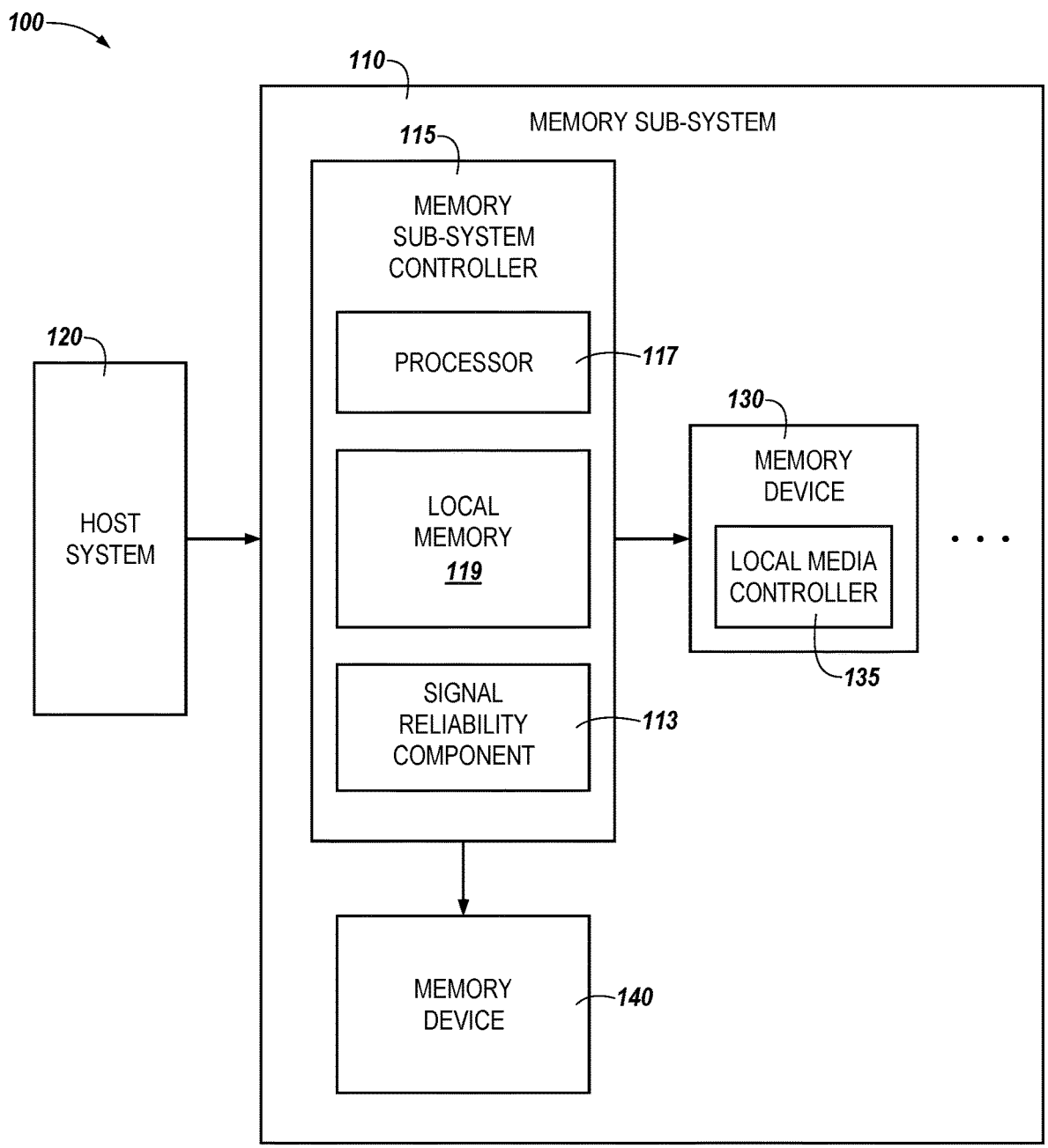
FIG. 1 illustrates an example computing system that includes a memory sub-system in accordance with some embodiments of the present disclosure.

Aspects of the present disclosure are directed to memory dice arrangement based on signal distribution, in particular to memory sub-systems that include memory dice that are arranged within a memory device based on determined characteristics of the memory dice. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of a non-volatile memory device is a three-dimensional cross-point memory device that include a cross-point array of non-volatile memory cells. Other examples of non-volatile memory devices are described below in conjunction with FIG. 1. A non-volatile memory device, such as a three-dimensional cross-point memory device, can be a package of one or more dice. Each die can consist of one or more planes. Planes can be groups into logic units. For example, a non-volatile memory device can be assembled from multiple memory dice, which can each form a constituent portion of the memory device.

Due to process variation, distances signals must travel through a memory device, and/or because a non-volatile memory device can be formed of one or more memory dice, signal reliability (e.g., electrical signal reliability) across or through the memory device can be non-uniform. Non-uniform signal reliability can lead to degraded and/or unpredictable performance of the memory device. Further, the non-uniform signal reliability that can be associated with a memory device can be amplified based on a workload the memory device is subjected to and/or characteristics of the environment in which the memory device is deployed, such as the ambient temperature of a location in which the memory device operates.

In some memory devices, such as three-dimensional cross-point memory devices, a minimum system access unit can generally be spread across more than one memory die. Accordingly, when a memory operation (e.g., a read, write, or other memory operation) is invoked, data can be read from and/or written to locations in different memory dice of the memory device. Because different memory dice can experience different signal reliability, as described above, performance of the memory device as a whole can be degraded when a memory operation is invoked that accesses data stored in or written to different memory dice. For example, the memory die or memory dice that exhibit the lowest signal reliability within the memory device can become a chokepoint or bottlenecks for performance of memory operations.

In some approaches, the above issues are addressed via design modifications and/or through the use of advanced materials. However, such approaches can be costly—both in terms of financial costs and in terms of time in research and development. Further, such approaches may not yield memory devices that are aligned with industry standards and/or may not exhibit ideal performance in other aspects of operation.

Aspects of the present disclosure address the above and other deficiencies by arranging memory dice within a memory device based on determined signal reliability parameters and/or characteristics of the memory device and/or of the memory dice. For example, aspects of the present disclosure can allow for each memory die that will be used in a memory device to be tested or otherwise analyzed to determine signal reliability characteristics associated therewith. The memory dice can then be arranged within the memory device, for example, at manufacture, in a manner that mitigates adverse effects of non-uniform signal reliability across the memory dice.

In some embodiments, the memory dice can be arranged such that memory dice that exhibit the highest signal reliability characteristics can be located in positions that are farther away from a memory controller (e.g., a processing device and/or power supply unit) associated with the memory device than memory dice that exhibit lower signal reliability characteristics, and vice versa. Such an arrangement can improve performance of the memory device at least because the memory dice that are more likely to be subject to non-uniform signals can be selected to be the memory dice that exhibit the highest reliability characteristics, while the memory dice that are less likely to be subject to non-uniform signals can be selected to be the memory dice that exhibit the lowest reliability characteristics.

Embodiments are not so limited, however, and in some embodiments, the memory die having a highest ranked signal reliability characteristic can be physically located at a position within the memory device that exhibits a lower signal routing characteristic than a memory die having a lower ranked signal reliability characteristic. Conversely, a memory die having a lowest ranked signal reliability characteristic can be physically located at a position within the memory device that exhibits a higher signal routing characteristic than a memory die having a lower ranked signal reliability characteristic. That is, in some embodiments, the memory dice can be arranged within the memory device based on the physical signal routing paths throughout the memory device. Because the physical signal routing paths (e.g., the lengths, materials, layout, or other characteristics of the physical signal paths) within the memory device can impact the signal reliability characteristics of signals at different locations within the memory device, arranging the memory dice based on the signal reliability characteristics of the memory dice can improve the overall performance of a memory device in comparison to approaches that do not take the physical signal routing paths into consideration when arranging the memory dice within the memory device.

Further, in some embodiments, a memory die having the highest ranking can be arranged in a memory device such that a physical location of the memory die having the highest ranking is a location that exhibits topological characteristics that correspond to a higher signal strength than a physical location of a memory die than a memory die having a lower ranking. Conversely, a memory die having the lowest ranking is arranged in a memory device such that a physical location of the memory die having the lowest ranking can be a location that exhibits topological characteristics that correspond to a lower signal strength than a physical location of a memory die having a higher ranking. Because the physical topology (e.g., the sizes, locations, materials, or other characteristics of the components of the memory device) of the memory device can impact the signal reliability characteristics of signals at different locations within the memory device, arranging the memory dice based on the physical topology of the memory device can improve the overall performance of a memory device in comparison to approaches that do not take the physical topology of the memory device into consideration when arranging the memory dice within the memory device.

Stated alternatively, by arranging the "best" memory dice in the "worst" physical location of the memory device and the "worst" memory dice in the "best" physical location of the memory device, the overall effects of non-uniform signal reliability can be mitigated, thereby improving the overall performance of the memory device and, by extension, memory sub-system performance, which can be improved in comparison to approaches that do not arrange memory dice in the memory device according to determined signal reliability characteristics of the respective memory dice.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a signal reliability component 113. Although not shown in FIG. 1 so as to not obfuscate the drawings, the signal reliability component 113 can include various circuitry to facilitate determination of signal reliability characteristics of various memory dice (e.g., the memory dice 337-1 to 337-N illustrated in FIG. 3, herein). In addition, the signal reliability component 113 can perform operations to rank memory dice based on the determined signal reliability characteristics. For example, in some embodiments, the signal reliability component 113 can generate ranking information corresponding to memory dice that have determined signal reliability characteristics to provide a grade (e.g., best, second best, third best, worst, etc.) to memory dice that have determined reliability characteristics. In some embodiments, the signal reliability component 113 can include special purpose circuitry in the form of an ASIC, FPGA, state machine, and/or other logic circuitry that can allow the signal reliability component 113 to orchestrate and/or perform operations to selectively throttle or delay data written to the memory device 130 and/or the memory device 140 based on workload characteristics.

In some embodiments, the memory sub-system controller 115 includes at least a portion of the signal reliability component 113. For example, the memory sub-system controller 115 can include a processor 117 (processing device) configured to execute instructions stored in local memory 119 for performing the operations described herein. In some embodiments, the signal reliability component 113 is part of the host system 110, an application, or an operating system.

Figure 2:
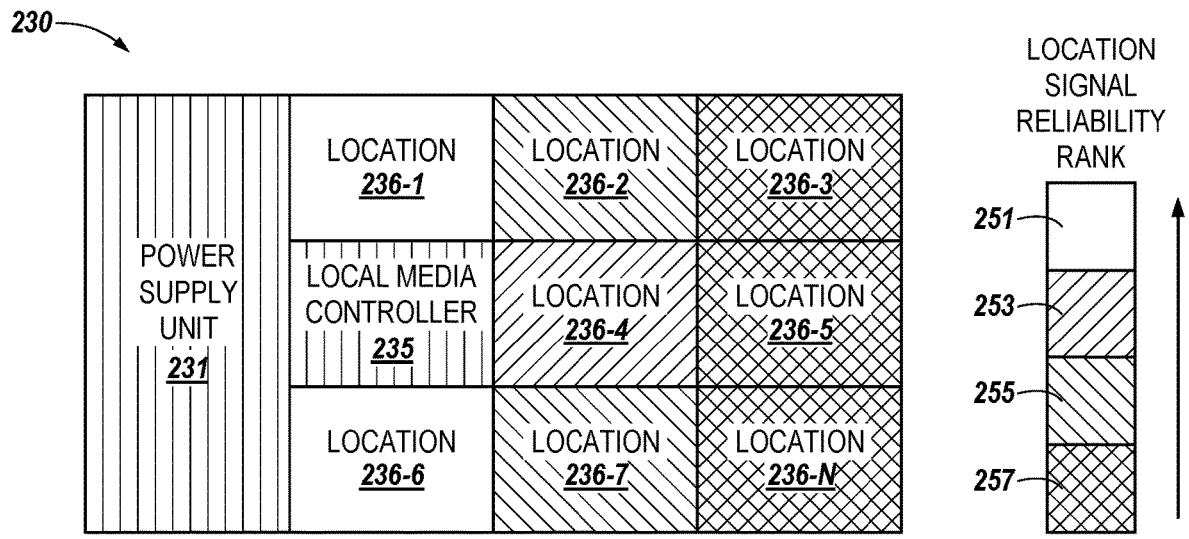
FIG. 2 illustrates an example of a memory device including a plurality of memory die locations in accordance with some embodiments of the present disclosure.

FIG. 2 illustrates an example of a memory device 230 including a plurality of memory die locations 236-1 to 236-N in accordance with some embodiments of the present disclosure. As shown in FIG. 2, the memory device 230 can include a power supply unit 231 and a local media controller 235, which can be analogous to the local media controller 135 illustrated in FIG. 1, herein. The power supply unit 231 can provide an electrical signal to the local media controller 235 and/or memory dice (e.g., the memory dice 337-1 to 337-N illustrated in FIG. 3, herein) to power the local media controller 235 and/or the memory dice, effectively providing electrical power to the memory device 230.

As shown in FIG. 2, the local media controller 235 and the power supply unit 231 can be resident on the memory device 230. As used herein, the term "resident on" refers to something that is physically located on a particular component. For example, the local media controller 235 and the power supply unit 231 being "resident on" the memory device 230 refers to a condition in which the hardware circuitry that comprises the local media controller 235 and the power supply unit 231 is physically located on the memory device 230. The term "resident on" may be used interchangeably with other terms such as "deployed on" or "located on," herein.

As shown in FIG. 2, the memory device 230 can include multiple locations 236-1 to 236-N. The locations 236-1 to 236-N can represent physical spaces within the memory device 230 in which memory dice can be arranged. Although the locations 236-1 to 236-N are shown in a particular configuration in the example of FIG. 2, embodiments are not limited to this particular configuration or orientation and the locations 236-1 to 236-N can be provided in different configurations and/or orientations depending on the topology of the memory device 230.

The locations 236-1 to 236-N can have different signal reliabilities associated therewith. For example, because the quality of a signal generated by the power supply unit 231 and/or the local media controller 235 can degrade as it is transmitted farther and farther away from its origin, locations that are farther away (e.g., the locations 236-3, 236-5, and/or 236-N) can generally receive signals that have a lower reliability than locations that are closer (e.g., the locations 236-1 and 236-6) to the power supply unit 231 and/or the local media controller 235.

The legend at the right side of FIG. 2 illustrates a hatching/cross-hatching convention that is used throughout the disclosure in which signal reliability is indicated by various hatching and cross-hatching patterns. In FIG. 2, the highest location signal reliability rank 251 is indicated by areas that are devoid of a hatching or cross-hatching pattern. A second highest location signal reliability rank 253 is indicated by areas that include a first hatching pattern, whereas a third highest (or second worst, in the example of FIG. 2) location signal reliability rank 255 is indicated by a second hatching pattern. A lowest location signal reliability rank 257 is indicated by areas that include a cross-hatching pattern. Accordingly, FIG. 2 shows an example in which the location signal reliability rank increases for locations 236-1 to 236-N that are physically closer to the power supply unit 231 and/or the local media controller 235.

Although the signal reliability for each of the locations 236-1 to 236-N is shown as decreasing solely based on the respective distances between the locations 236-1 to 236-N and the power supply unit 231 and/or the local media controller 235, due to process variations in manufacture of the memory device 230, the locations 236-1 to 236-N can exhibit signal reliabilities that are not solely based on the respective distances between the locations 236-1 to 236-N and the power supply unit 231 and/or the local media controller 235. In order to account for discrepancies in the presumed signal reliability for each of the locations 236-1 to 236-N, in some embodiments, each location 236-1 to 236-N can be tested, for example, using the signal reliability component 113 illustrated in FIG. 1 and FIG. 6, herein. For example, the signal reliability component can perform various testing operations, such as voltage scan tests, to determine the signal reliability of each of the locations 236-1 to 236-N. In such embodiments, the signal reliability component can further rank the locations 236-1 to 236-N based on the results of the testing operations to grade the signal reliability for each of the locations 236-1 to 236-N.

Figure 3:
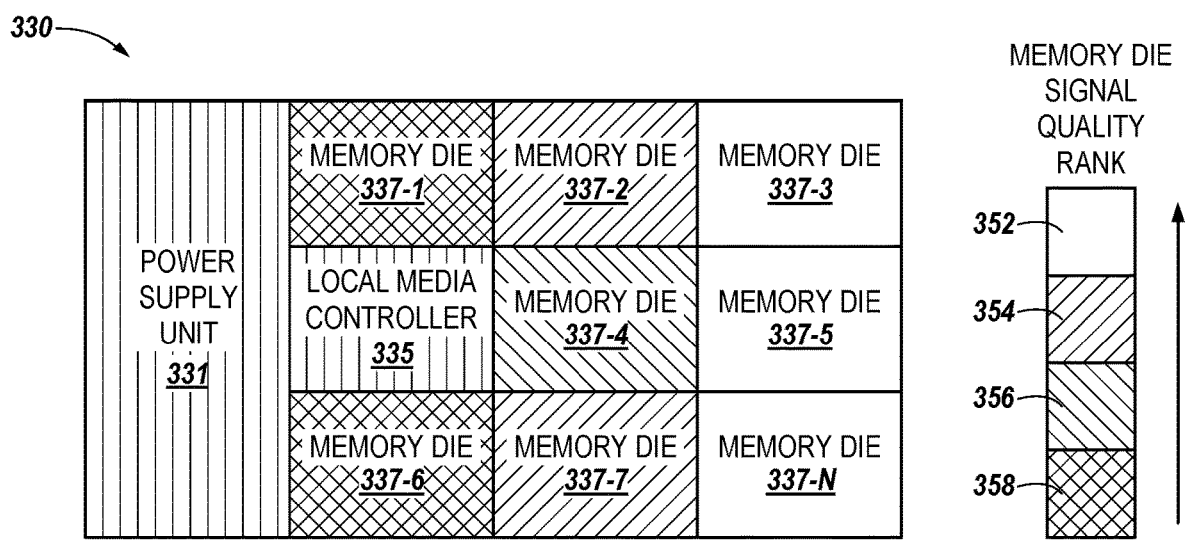
FIG. 3 illustrates an example of a memory device including a plurality of memory dice in accordance with some embodiments of the present disclosure.

FIG. 3 illustrates an example of a memory device 330 including a plurality of memory dice 337-1 to 337-N in accordance with some embodiments of the present disclosure. As shown in FIG. 3, the memory device 330 can include a power supply unit 331, which can be analogous to the power supply unit 231 illustrated in FIG. 2 and a local media controller 335, which can be analogous to the local media controller 235 illustrated in FIG. 2.

The legend at the right side of FIG. 3 illustrates a hatching/cross-hatching convention that is used throughout the disclosure in which memory die signal quality rankings are indicated by various hatching and cross-hatching patterns. In FIG. 3, the highest memory die signal quality rank 352 is indicated by areas that are devoid of a hatching or cross-hatching pattern. A second highest memory die signal quality rank 354 is indicated by areas that include a first hatching pattern, whereas a third highest (or second worst, in the example of FIG. 3) memory die signal quality rank 356 is indicated by a second hatching pattern. A lowest memory die signal quality rank 358 is indicated by areas that include a cross-hatching pattern. Accordingly, FIG. 3 shows an example in which the memory dice 337-1 to 337-N are arranged such that the memory die signal quality rank decreases for locations (e.g., the locations 236-1 to 236-N illustrated in FIG. 2) that are physically closer to the power supply unit 331 and/or the local media controller 335.

The memory dice 337-1 to 337-N can be arranged within the memory device 330 according to the respective signal reliabilities (e.g., signal quality ranks) for each of the memory dice 337-1 to 337-N. For example, prior to arranging the memory dice 337-1 to 337-N within the memory device 330, the respective signal reliabilities and/or signal quality ranks for each of the memory dice 337-1 to 337-N can be determined and the memory dice 337-1 to 337-N can be arranged within the memory device 330 according to the determined signal reliabilities and/or signal quality ranks.

Figure 6:
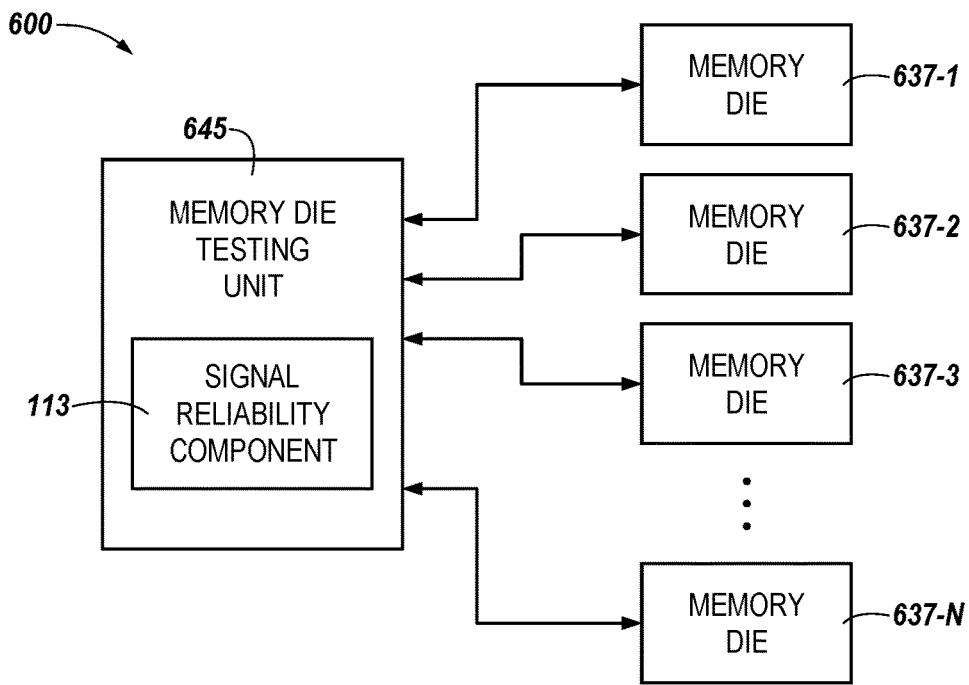
FIG. 6 illustrates an example computing system that includes a memory die testing unit in accordance with some embodiments of the present disclosure.

In some embodiments, each memory die 337-1 to 337-N can be tested, for example, using the signal reliability component 113 illustrated in FIG. 1 and FIG. 6, herein. For example, the signal reliability component can perform various testing operations, such as voltage scan tests, to determine the signal reliability of each of the memory dice 337-1 to 337-N. In such embodiments, the signal reliability component can further rank the memory dice 337-1 to 337-N based on the results of the testing operations to assign a grade to the signal reliability for each of the memory dice 337-1 to 337-N.

Figure 5:
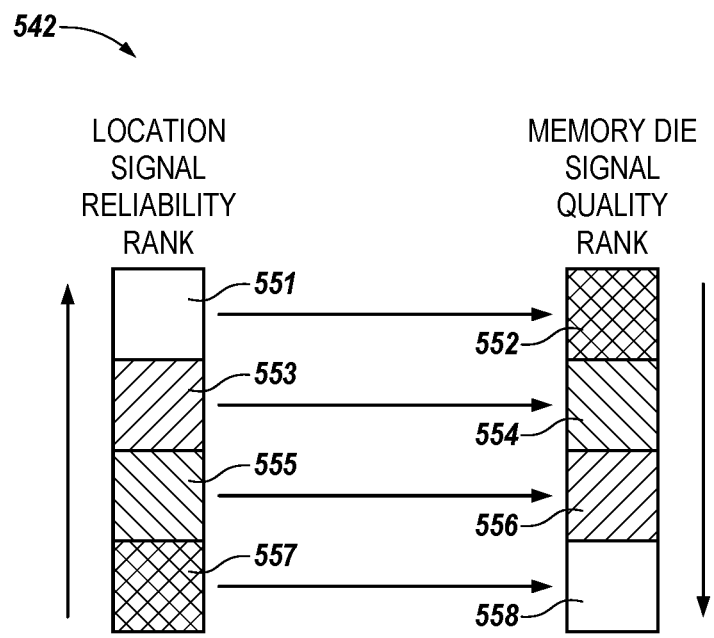
FIG. 5 illustrates an example block diagram of memory device location signal reliability rank matching based on memory die signal ranks in accordance with some embodiments of the present disclosure.

As shown in FIG. 3, and as described in additional detail in connection with FIG. 5, herein, the memory dice 337-1 to 337-N that exhibit the highest signal reliabilities and/or have been assigned the highest signal quality ranks can be arranged such that they are in locations (e.g., the locations 236-1 to 236-N shown in FIG. 2) that exhibit the lowest location signal reliability ranks. Similarly, the memory dice 337-1 to 337-N that exhibit the lowest signal reliabilities and/or have been assigned the lowest signal quality ranks can be arranged such that they are in locations (e.g., the locations 236-1 to 236-N) that exhibit the highest location signal reliability ranks. In some embodiments, the memory dice 337-1 to 337-N that exhibit signal reliabilities between the highest and lowest ranks and/or that have been assigned signal quality ranks between the highest and lowest ranks can be arranged such that they are in locations (e.g., the locations 236-1 to 236-N) that exhibit the location signal reliability ranks that are neither the highest nor the lowest.

In a non-limiting example, the local media controller 335 can be a processing device that is communicatively coupled to a memory device 330 that includes memory dice 337-1 to 337-N that are arranged in particular physical locations (e.g., the locations 236-1 to 236-N illustrated in FIG. 2, herein) with respect to the processing device based, at least in part, on determined signal reliability characteristics (e.g., voltage fluctuation characteristics, voltage sensitivity characteristics) collected for each of the memory dice 337-1 to 337-N. The particular physical locations with respect to the processing device can be selected for each of the memory dice 337-1 to 337-N based, at least in part, on a ranking of the determined signal reliability characteristics. In some embodiments, a power supply unit 331 can be resident on the memory device 330 and the memory dice 337-1 to 337-N can further be arranged in the particular physical locations with respect to the power supply unit 331 based, at least in part, on determined signal characteristics collected for each of the memory dice 337-1 to 337-N.

Continuing with this example, in some embodiments, a particular physical location of a memory die having a highest determined signal reliability characteristic (e.g., the memory die 337-1) can be at a distance from the processing device that is greater than a particular physical location of a memory die having a lower determined signal reliability characteristic (e.g., the memory die 337-2 or the memory die 337-1). Conversely, in some embodiments, a particular physical location of a memory die having a lowest determined signal reliability characteristic (e.g., the memory die 337-1 or the memory die 337-6) can be at a distance from the processing device that is less than a particular physical location of a memory die having a higher determined signal reliability characteristic (e.g., the memory die 337-4 or the memory die 337-3).

By arranging the memory dice 337-1 to 337-N based on the determined signal reliability characteristics and/or rankings such that memory dice 337-1 to 337-N having higher signal reliability characteristics and/or rankings are in locations of the memory device 330 that have lower signal reliability characteristics and/or rankings, performance of the memory device 330 can be improved in comparison to approaches in which components of the memory device 330 are arranged in an ad hoc fashion. Further, by arranging the memory dice 337-1 to 337-N based on the determined signal reliability characteristics and/or rankings such that memory dice 337-1 to 337-N having higher signal reliability characteristics and/or rankings are in locations of the memory device 330 that have lower signal reliability characteristics and/or rankings, a higher percentage of manufactured memory dice 337-1 to 337-N can be used in a memory device 330 than in approaches in which memory dice 337-1 to 337-N that do not surpass a threshold performance rating are discarded.

Figure 4:
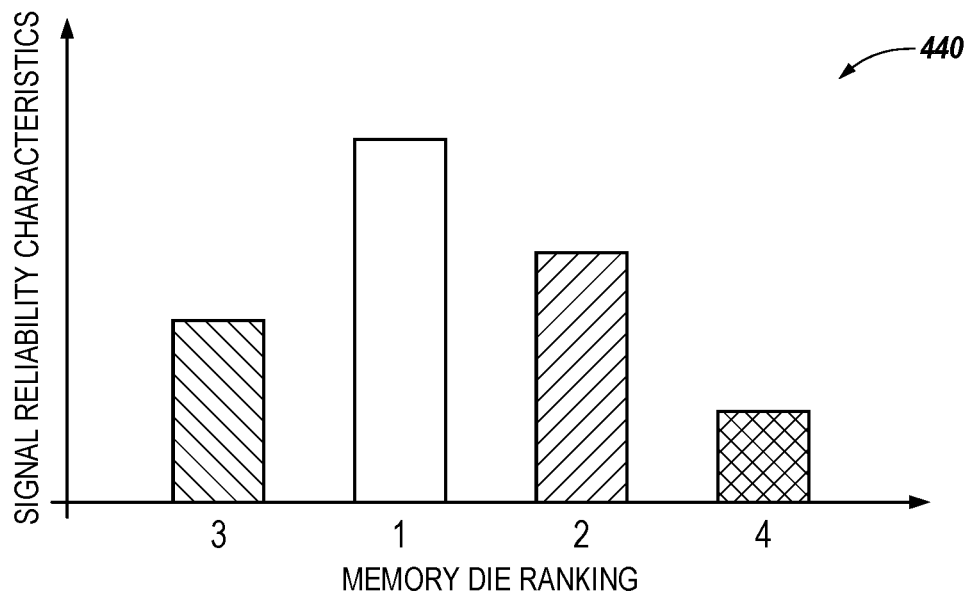
FIG. 4 illustrates an example plot of memory die rankings vs signal reliability characteristics in accordance with some embodiments of the present disclosure.

FIG. 4 illustrates an example plot 440 of memory die rankings vs signal reliability characteristics in accordance with some embodiments of the present disclosure. The x-axis of the plot 440 shows rankings of memory dice, while the y-axis of the plot 440 shows determined signal reliability characteristics for the memory dice. As discussed above, the signal reliability characteristics can be determined by the signal reliability component 113 illustrated in FIG. 1 and FIG. 6, herein.

In the example plot 440 shown in FIG. 4, four memory dice, which can be analogous to the memory dice 337-1 to 337-N illustrated in FIG. 3, herein, are ranked according to determined signal reliability characteristics associated with each of the memory dice. The hatching and cross-hatching patterns shown in FIG. 4 follow the convention described above in connection with FIG. 2 and FIG. 3. In this example, the memory die that has the highest determined signal reliability characteristic is ranked as "1." The memory die that has the second highest determined signal reliability characteristic is ranked as "2." Similarly, the memory die that has the third highest determined signal reliability characteristic is ranked as "3," while the memory die that has the third highest determined signal reliability characteristic is ranked as "4."

As described above, the memory dice can be arranged within a memory device (e.g., the memory device 330 illustrated in FIG. 3, herein) based on the determined signal reliability characteristics and/or ranks. For example, memory dice having higher determined signal reliability characteristics and/or ranks can be arranged in locations (e.g., the locations 236-1 to 236-N illustrated in FIG. 2, herein) that have lower location signal reliability characteristics and/or ranks. This concept is further illustrated below in connection with FIG. 5.

FIG. 5 illustrates an example block diagram 542 of memory device location signal reliability rank matching based on memory die signal ranks in accordance with some embodiments of the present disclosure. The hatching and cross-hatching patterns shown in FIG. 5 follow the convention described above in connection with FIG. 2 and FIG. 3.

As shown in FIG. 5, locations (e.g., the locations 236-1 to 236-N illustrated in FIG. 2, herein) of a memory device (e.g., the memory device 230 illustrated in FIG. 2, herein) can be matched with memory dice (e.g., the memory dice 337-1 to 337-N illustrated in FIG. 3, herein) based on the signal reliability characteristics and/or signal quality ranks determined for the locations and/or the memory dice. For example, a location having a highest location signal reliability rank 551 can be matched with a memory die that has a lowest memory die signal quality rank 552. Further, a location having a second highest location signal reliability rank 553 can be matched with a memory die that has a second lowest memory die signal quality rank 554, while a location having a third highest location signal reliability rank 555 can be matched with a memory die that has a third lowest memory die signal quality rank 556. Finally, a location having a lowest location signal reliability rank 557 can be matched with a memory die that has a highest memory die signal quality rank 558.

FIG. 6 illustrates an example computing system 600 that includes a memory die testing unit 645 in accordance with some embodiments of the present disclosure. The memory die testing unit 645 can include a signal reliability component 113, which can be analogous to the signal reliability component 113 illustrated in FIG. 1, herein. As shown in FIG. 6, the memory die testing unit can be coupled to one or more memory dice 637-1 to 637-N, which can be analogous to the memory dice 337-1 to 337-N illustrated in FIG. 3, herein.

The memory die testing unit 645 can include various hardware components and/or logic that can execute instructions to perform the operations described herein. In some embodiments, the memory die testing unit 645 can be deployed in a wafer prober or other semiconductor device fabrication and/or testing device. Accordingly, some embodiments herein can be performed at a testing stage and/or a manufacturing stage of a memory device.

During testing and/or fabrication of a memory device, the memory die testing unit 645 can perform tests using, for example, the signal reliability component 113 to determine signal reliability characteristics for the memory dice 637-1 to 637-N. The memory die testing unit 645 and/or the signal reliability component 113 can use the results of the tests conducted on the memory dice 637-1 to 637-N to rank the memory dice 637-1 to 637-N in an order based on the determined signal reliability characteristics, as shown in FIG. 4.

In a non-limiting example in which the memory die testing unit 645 is coupled to the memory dice 637-1 to 637-N, the memory die testing unit 645 can perform various operations. For example, the memory die testing unit 645 can perform a testing operation for each of the memory dice 637-1 to 637-N to determine signal reliability characteristics corresponding to respective memory dice 637-1 to 637-N.

Continuing with this example, in some embodiments, the memory die testing unit 645 can perform an operation to generate a ranking for each of the memory dice 637-1 to 637-N based, at least in part, on the determined signal reliability characteristics corresponding to the respective memory dice 637-1 to 637-N. The signal reliability characteristics can include a voltage fluctuation characteristic and/or a voltage sensitivity characteristic, although embodiments are not limited to these enumerated examples.

As described above in connection with FIG. 5, the rankings generated by the memory die testing unit 645 can correspond to a physical location (e.g., the location 236-1 to 236-N illustrated n FIG. 2, herein) in a memory device (e.g., the memory device 230 illustrated in FIG. 2, herein) in which each of the memory dice 637-1 to 637-N are to be arranged. For example, if the ranking generated by the memory die testing unit 645 for a particular memory die (e.g., the memory die 637-1) is a highest ranking among the ranked memory dice 637-1 to 637-N, the memory die 637-1 can be arranged in a location of a memory device having a lowest location signal reliability rank (e.g., the location 236-3 illustrated in FIG. 2, herein). Conversely, if the ranking generated by the memory die testing unit 645 for a particular memory die (e.g., the memory die 637-2) is a lowest ranking among the ranked memory dice 637-1 to 637-N, the memory die 637-2 can be arranged in a location of a memory device having a highest location signal reliability rank (e.g., the location 236-1 illustrated in FIG. 2, herein).

Stated alternatively, in some embodiments, a highest ranking determined by the memory die testing unit 645 can correspond to a highest determined signal reliability characteristic and a memory die having the highest ranking (e.g., the memory die 637-1) can be arranged in a memory device such that a physical location of the memory die having the highest ranking (e.g., the memory die 637-1) is a location that is farther away from a processing device (e.g., the local media controller 235 illustrated in FIG. 2) resident on the memory device than a memory die having a lower ranking (e.g., the memory die 637-2). Conversely, in some embodiments, a lowest ranking determined by the memory die testing unit 645 can correspond to a lowest determined signal reliability characteristic and a memory die having the lowest ranking (e.g., the memory die 637-2) can be arranged in a memory device such that a physical location of the memory die having the lowest ranking (e.g., the memory die 637-2) is a location that is closer to a processing device resident on the memory device than a memory die having a higher ranking (e.g., the memory die 637-1).

Embodiments are not so limited, however, and in some embodiments, a highest ranking determined by the memory die testing unit 645 can correspond to a highest determined signal reliability characteristic and a memory die having the highest ranking (e.g., the memory die 637-1) can be arranged in a memory device such that a physical location of the memory die having the highest ranking (e.g., the memory die 637-1) is a location that is farther away from a power supply unit (e.g., the power supply unit 231 illustrated in FIG. 2) resident on the memory device than a memory die having a lower ranking (e.g., the memory die 637-2). Conversely, in some embodiments, a lowest ranking determined by the memory die testing unit 645 can correspond to a lowest determined signal reliability characteristic and a memory die having the lowest ranking (e.g., the memory die 637-2) can be arranged in a memory device such that a physical location of the memory die having the lowest ranking (e.g., the memory die 637-2) is a location that is closer to a power supply unit resident on the memory device than a memory die having a higher ranking (e.g., the memory die 637-1).

Figure 7:
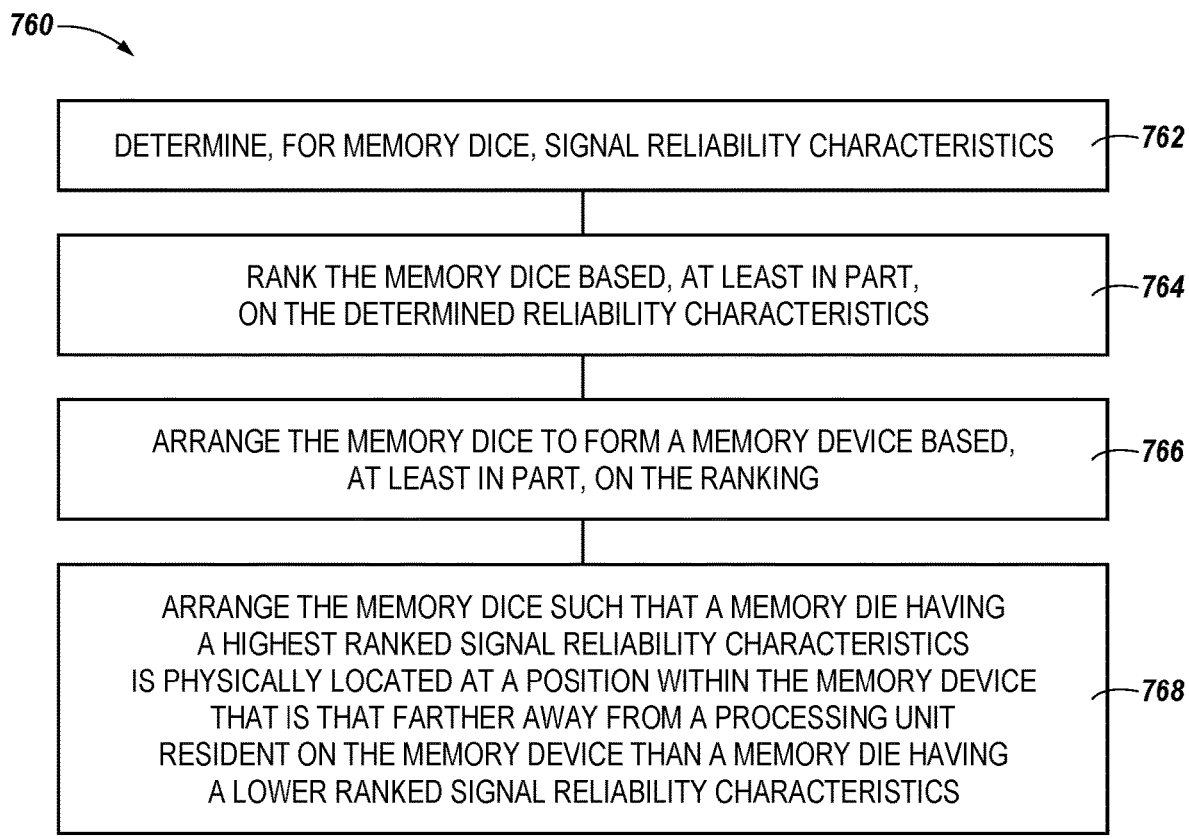
FIG. 7 is a flow diagram corresponding to a method for memory dice arrangement based on signal distribution in accordance with some embodiments of the present disclosure.

FIG. 7 is flow diagram corresponding to a method 760 for memory dice arrangement based on signal reliability in accordance with some embodiments of the present disclosure. The method 760 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 760 is performed by the signal reliability component 113 of FIG. 1 and/or FIG. 6. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 762, the method 760 can include determining, for one or more memory dice, signal reliability characteristics associated with each of the memory dice. The one or more memory dice can be analogous to the memory dice 337-1 to 337-N illustrated in FIG. 3, herein. In some embodiments, the method 760 can include determining the signal reliability characteristics by determining an electrical signal reliability for each of the memory dice. As described above, the signal reliability characteristic can be determined using a memory die testing unit, such as the memory die testing unit 645 illustrated in FIG. 6 couplable to the memory dice.

At block 764, the method 760 can include ranking the memory dice based, at least in part, on the determined reliability characteristics. As described above, the determined reliability characteristics can include signal reliability characteristics, such as voltage fluctuation characteristics, voltage sensitivity characteristics, etc.

At block 766, the method 760 can include arranging the memory dice to form a memory device based, at least in part, on the ranking. The memory device can be analogous to the memory device 130 illustrated in FIG. 1, herein. In some embodiments, the method 760 can include arranging the memory dice to form the memory device at manufacture of the memory device.

At block 768, the method 766 can include arranging the memory dice such that a memory die having a highest ranked signal reliability characteristic is physically located at a position within the memory device that is that farther away from a processing unit (e.g., the local media controller 335 illustrated in FIG. 3, herein) resident on the memory device than a memory die having a lower ranked signal reliability characteristic. Embodiments are not so limited, however, and in some embodiments, the method 760 can include arranging the memory dice such that a memory die having a lowest ranked signal reliability characteristic is physically located at a position within the memory device that is that closer to a processing unit resident on the memory device than a memory die having a higher ranked signal reliability characteristic.

Embodiments are not so limited, however, and, as described above, the memory die having a highest ranked signal reliability characteristic can be physically located at a position within the memory device that exhibits a lower signal routing characteristic than a memory die having a lower ranked signal reliability characteristic and/or a memory die having a lowest ranked signal reliability characteristic can be physically located at a position within the memory device that exhibits a higher signal routing characteristic than a memory die having a lower ranked signal reliability characteristic. That is, in some embodiments, the memory dice can be arranged within the memory device based on the physical signal routing paths throughout the memory device. Because the physical signal routing paths (e.g., the lengths, materials, layout, or other characteristics of the physical signal paths) within the memory device can impact the signal reliability characteristics of signals at different locations within the memory device, arranging the memory dice based on the signal reliability characteristics of the memory dice can improve the overall performance of a memory device in comparison to approaches that do not take the physical signal routing paths into consideration when arranging the memory dice within the memory device.

Further, in some embodiments, a memory die having the highest ranking can be arranged in a memory device such that a physical location of the memory die having the highest ranking is a location that exhibits topological characteristics that correspond to a higher signal strength than a physical location of a memory die than a memory die having a lower ranking and/or a memory die having the lowest ranking is arranged in a memory device such that a physical location of the memory die having the lowest ranking can be a location that exhibits topological characteristics that correspond to a lower signal strength than a physical location of a memory die having a higher ranking. Because the physical topology (e.g., the sizes, locations, materials, or other characteristics of the components of the memory device) of the memory device can impact the signal reliability characteristics of signals at different locations within the memory device, arranging the memory dice based on the physical topology of the memory device can improve the overall performance of a memory device in comparison to approaches that do not take the physical topology of the memory device into consideration when arranging the memory dice within the memory device.

Figure 8:
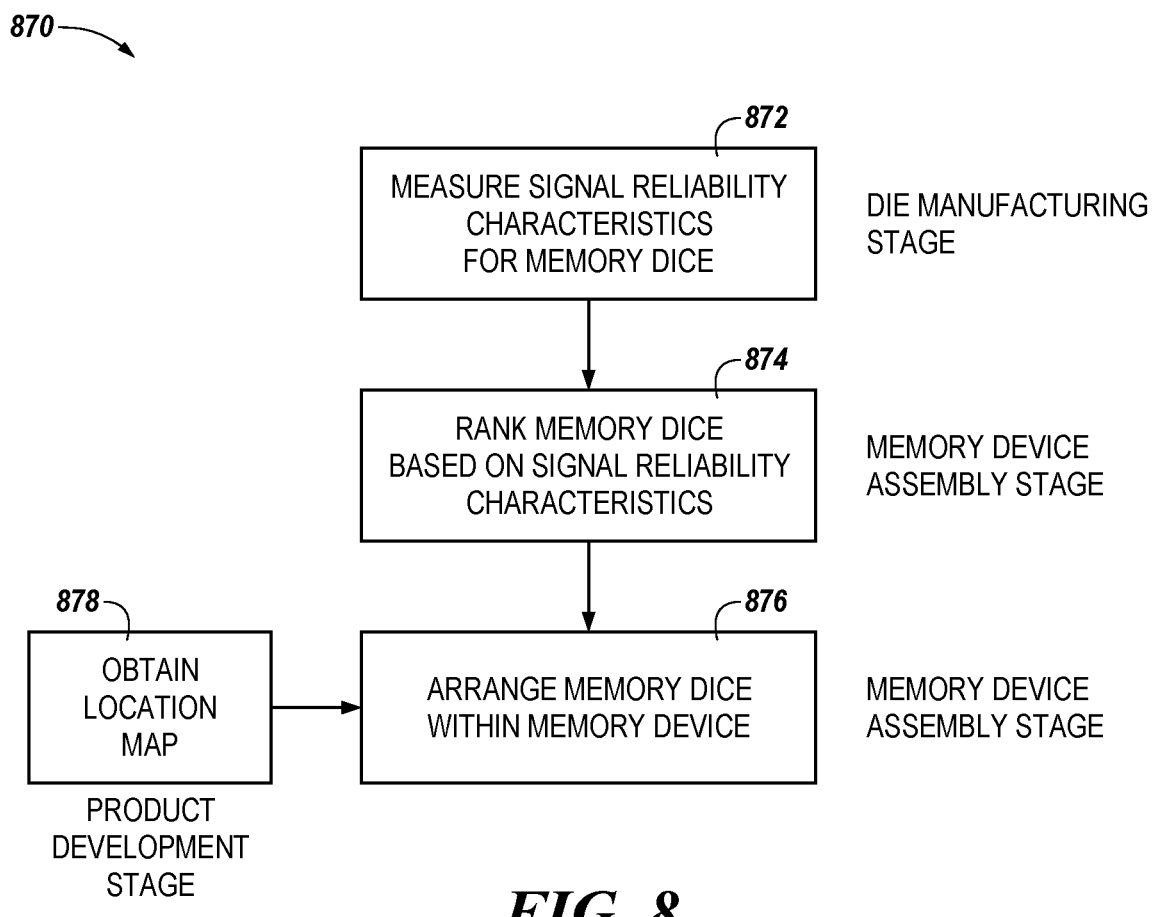
FIG. 8 is a flow diagram corresponding to memory dice arrangement in accordance with some embodiments of the present disclosure.

FIG. 8 is a flow diagram 870 corresponding to memory dice arrangement in accordance with some embodiments of the present disclosure. At block 872, signal reliability characteristics for memory dice can be measured. In some embodiments, the signal reliability characteristics for the memory dice can be measured during a memory die manufacturing stage of a memory device manufacture process.

At block 874, the memory dice can be ranked according to the signal reliability characteristics that were measured at block 872. In some embodiments, the memory dice can be ranked during a memory device assembly stage of the memory device manufacture process.

At block 876, the memory dice can be arranged within a memory device. As described above, the memory dice can be arranged within the memory device based on the respective measured signal reliability characteristics of the memory dice and/or the rankings of the memory dice. In some embodiments, the memory dice can be arranged within the memory device during a memory device assembly stage of the memory device manufacture process.

In some embodiments, as shown at block 878, a location map corresponding to the memory device can be obtained. The location map can correspond to the locations 236-1 to 236-N illustrated in connection with FIG. 2, herein. As shown in FIG. 8, the location map can be obtained during a product development stage of a memory device at which time topographical information, signal path and/or routing information, and/or power supply unit layout location, and/or processing device layout locations, among others factors relevant to the location map can be determined.

Figure 9:
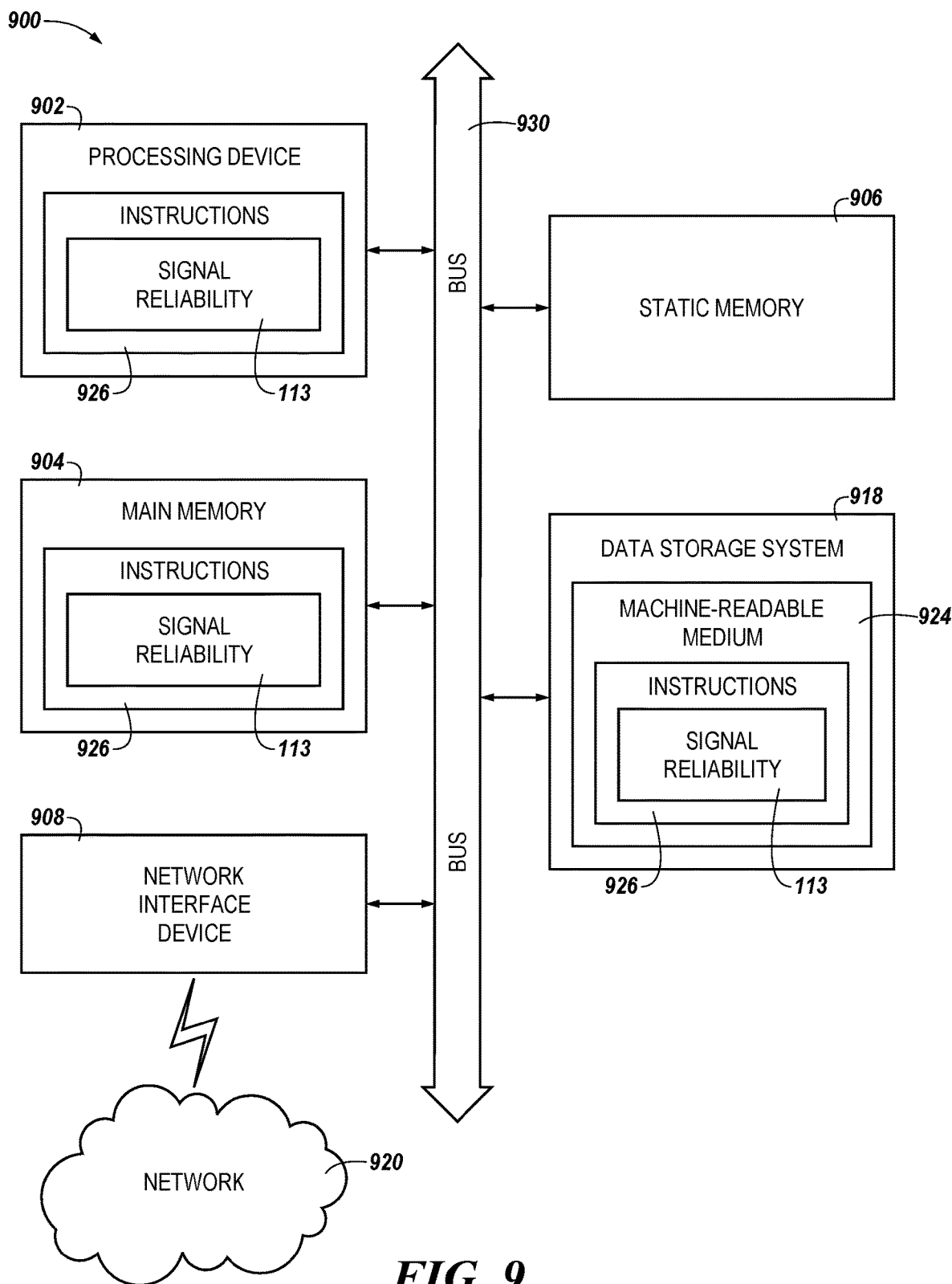
FIG. 9 is a block diagram of an example computer system in which embodiments of the present disclosure may operate.

FIG. 9 is a block diagram of an example computer system 900 in which embodiments of the present disclosure may operate. For example, FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the signal reliability component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

The processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1 and/or the memory die testing unit 645 of FIG. 6.

In one embodiment, the instructions 926 include instructions to implement functionality corresponding to a signal reliability component (e.g., the signal reliability component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   determining, for a plurality of memory dice, signal reliability characteristics associated with each of the memory dice;
   determining, for a plurality of respective physical locations to receive the plurality of memory dice associated with a memory device, electrical signal reliability characteristics associated with respective physical locations;
   ranking the plurality of memory dice based, at least in part, on the determined signal reliability characteristics; and
   arranging the plurality of memory dice in the respective physical locations to receive the plurality of memory devices to form a memory device based, at least in part, on the ranking and the determined electrical signal reliability characteristics associated with respective physical locations, wherein the electrical reliability characteristics associated with the respective physical locations correspond to an electrical signal quality based on a distance of the respective physical locations from a power supply resident on the memory device.

2. The method of claim 1, wherein determining the signal reliability characteristics comprises determining an electrical signal reliability for each of the memory dice.

3. The method of claim 1, further comprising arranging the plurality of memory dice to form the memory device at manufacture of the memory device.

4. The method of claim 1, wherein the signal reliability characteristics are determined using a memory die testing unit couplable to the plurality of memory dice.

5. The method of claim 1, further comprising arranging the plurality of memory dice such that:
   a memory die having a highest ranked signal reliability characteristic is physically located at a position within the memory device that is that farther away from a processing unit resident on the memory device than a memory die having a lower ranked signal reliability characteristic, or
   a memory die having a lowest ranked signal reliability characteristic is physically located at a position within the memory device that is that closer to a processing unit resident on the memory device than a memory die having a higher ranked signal reliability characteristic.

6. The method of claim 1, further comprising arranging the plurality of memory dice such that:
   a memory die having a highest ranked signal reliability characteristic is physically located at a position within the memory device that exhibits a lower signal routing characteristic than a memory die having a lower ranked signal reliability characteristic, or
   a memory die having a lowest ranked signal reliability characteristic is physically located at a position within the memory device that exhibits a higher signal routing characteristic than a memory die having a lower ranked signal reliability characteristic.

7. An apparatus, comprising:
   a processing device; and
   a memory device comprising a plurality of memory dice communicatively coupled to the processing device, wherein the plurality of memory dice are arranged in particular physical locations with respect to the processing device based, at least in part, on determined signal reliability characteristics collected for each of the memory dice and determined electrical signal characteristics collected for each of the particular physical locations, wherein the determined electrical signal characteristics collected for each of the particular physical locations correspond to an electrical signal quality received at each of the particular physical locations based on a physical distance between each of the particular locations and the processing device; and
   a power supply unit resident on the memory device, wherein the plurality of memory dice are further arranged in the particular physical locations with respect to the power supply unit based, at least in part, on the determined signal characteristics collected for each of the memory dice and the determined electrical signal characteristics collected for each of the particular physical locations.

8. The apparatus of claim 7, wherein the particular physical locations with respect to the processing device are selected for each of the memory dice based, at least in part, on a ranking of the determined signal reliability characteristics.

9. The apparatus of claim 7, wherein a particular physical location of a memory die having a highest determined signal reliability characteristic corresponds to a location within the memory device that exhibits topological characteristics that are greater than a particular physical location of the memory device that exhibits lower topological characteristics.

10. The apparatus of claim 7, wherein:
    a particular physical location of a memory die having a lowest determined signal reliability characteristic that corresponds to physical signal paths within the memory device is at a distance from the processing device that is less than a particular physical location of a memory die having a higher determined signal reliability characteristic that corresponds to physical signal paths within the memory device, or
    a particular physical location of a memory die having a highest determined signal reliability characteristic that corresponds to physical signal paths within the memory device is at a distance from the processing device that is greater than a particular physical location of a memory die having a lower determined signal reliability characteristic that corresponds to physical signal paths within the memory device.

11. The apparatus of claim 7, wherein the memory device comprises a stackable cross-gridded array of memory cells.

12. The apparatus of claim 7, wherein the signal reliability characteristic comprises a voltage fluctuation characteristic, a voltage sensitivity characteristic, or both.

13. A system, comprising:
a plurality of memory dice arranged to form a memory device;
a power supply resident on the memory device; and
a memory die testing unit couplable to the plurality of memory dice, the memory die testing unit to perform operations comprising:
  performing a testing operation for each of the plurality of memory dice to determine signal reliability characteristics corresponding to respective memory dice among the plurality of memory dice; and
  generating a ranking for each of the memory dice based, at least in part, on the determined signal reliability characteristics corresponding to the respective memory dice;
  performing a testing operation for each of a plurality of physical locations to receive respective memory dice among the plurality of memory dice to determine an electrical signal quality corresponding to each of the plurality of physical locations; and
  generating an arrangement for the plurality of memory dice to be received by respective physical locations among the plurality of physical locations based on the ranking for each of the memory dice and the determined electrical signal quality corresponding to each of the plurality of physical locations.

14. The system of claim 13, wherein the signal reliability characteristics comprise a voltage fluctuation characteristic, a voltage sensitivity characteristic, or both.

15. The system of claim 13, wherein the ranking corresponds to a physical location in the memory device in which each of the memory dice are to be arranged.

16. The system of claim 13, wherein a highest ranking corresponds to a highest determined signal reliability characteristic, and wherein a memory die having the highest ranking is arranged in the memory device such that a physical location of the memory die having the highest ranking is a location that is farther away from a processing device or the power supply, or both, resident on the memory device than a memory die having a lower ranking.

17. The system of claim 13, wherein a lowest ranking corresponds to a lowest determined signal reliability characteristic, and wherein a memory die having the lowest ranking is arranged in the memory device such that a physical location of the memory die having the lowest ranking is a location that is closer to a processing device or the power supply, or both, resident on the memory device than a memory die having a higher ranking.

18. The system of claim 13, wherein a highest ranking corresponds to a highest determined signal reliability characteristic, and wherein a memory die having the highest ranking is arranged in the memory device such that a physical location of the memory die having the highest ranking is a location that exhibits topological characteristics that correspond to a lower signal strength than a physical location of a memory die than a memory die having a higher ranking.

19. The system of claim 13, wherein a lowest ranking corresponds to a lowest determined signal reliability characteristic, and wherein a memory die having the lowest ranking is arranged in the memory device such that a physical location of the memory die having the lowest ranking is a location that exhibits topological characteristics that correspond to a higher signal strength than a physical location of a memory die having a lower ranking.

* * * * *